(12) United States Patent
Byeon (10) Patent No.: US 9,559,695 B2
(45) Date of Patent: Jan. 31, 2017

(54) DATA TRANSMISSION CIRCUIT

(71) Applicant: SK hynix Inc., Icheon-si, Gyeonggi-do (KR)

(72) Inventor: Sang Jin Byeon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 142 days.

(21) Appl. No.: 14/242,441

(22) Filed: Apr. 1, 2014

(65) Prior Publication Data
US 2015/0188542 A1    Jul. 2, 2015

(30) Foreign Application Priority Data
Dec. 30, 2013   (KR) .................. 10-2013-0166991

(51) Int. Cl.
| | | |
|---|---|---|
| H03B 1/00 | (2006.01) | |
| H03K 3/00 | (2006.01) | |
| H03K 19/003 | (2006.01) | |
| H03K 19/0175 | (2006.01) | |

(52) U.S. Cl.
CPC  *H03K 19/00315* (2013.01); *H03K 19/017509* (2013.01)

(58) Field of Classification Search
CPC .................. H03K 19/00361; H03K 19/00315; H03K 17/063; H04L 25/0278; H04L 25/0269
USPC .................................................. 327/108–112
See application file for complete search history.

(56) References Cited

U.S. PATENT DOCUMENTS

| | | | | |
|---|---|---|---|---|
| 4,737,471 A | * | 4/1988 | Shirato | ............. H01L 21/76218 |
| | | | | 148/DIG. 82 |
| 8,513,976 B2 | * | 8/2013 | Chang | ................. H04L 25/0278 |
| | | | | 326/26 |
| 2006/0071695 A1 | * | 4/2006 | Lee | ....................... H03K 17/167 |
| | | | | 327/112 |

FOREIGN PATENT DOCUMENTS

KR    1020060003434 A    1/2006

\* cited by examiner

*Primary Examiner* — Lincoln Donovan
*Assistant Examiner* — Diana J Cheng
(74) *Attorney, Agent, or Firm* — William Park & Associates Ltd.

(57) ABSTRACT

A data transmission circuit may include a first driving block configured to drive an output terminal for a first time in response to a data driving signal and a level of the output terminal, and a second driving block configured to drive the output terminal for a second time after the first time, in response to the data driving signal.

15 Claims, 5 Drawing Sheets

DATA TRANSMISSION CIRCUIT

CROSS-REFERENCES TO RELATED APPLICATION

The present application claims priority under 35 U.S.C. §119(a) to Korean application number 10-2013-0166991, filed on Dec. 30, 2013, in the Korean Intellectual Property Office, which is incorporated herein by reference in its entirety.

TECHNICAL FIELD

Various embodiments generally relate to a semiconductor circuit, and more particularly, to a data transmission circuit.

BACKGROUND

A conventional data transmission circuit includes a transmitter.

The transmitter may be electrically coupled with a receiver through a transmission line.

The transmitter may include a transistor wherein the leakage current characteristic of a transistor is likely to be degraded or a variation in VT (voltage or temperature) is likely to occur.

Therefore, when continuously outputting high level data, a problem may be caused in that the level of an output voltage continuously rises.

If the level of the output voltage continuously rises, reliability is likely to be degraded when subsequently outputting low level data.

SUMMARY

In an embodiment, a data transmission circuit may include: a first driving block configured to drive an output terminal for a first time in response to a data driving signal and a level of the output terminal; and a second driving block configured to drive the output terminal for a second time after the first time, in response to the data driving signal.

In an embodiment, a data transmission circuit may include: a driving block configured to drive an output terminal in response to a data driving signal; and a compensation block configured to control a current leakage amount of the output terminal in response to the data driving signal and a result of detecting a level of the output terminal, and thereby offset an increment in the level of the output terminal.

In an embodiment, a data transmission circuit may include: a transmitter configured to drive an output terminal for a first time by using first type logic elements, interrupt an driving which is proceeded by the first type logic elements, and drive the output terminal for a second time after the first time by using second type logic elements which are designed to have different threshold voltages from the first type logic elements; and a receiver electrically coupled with the transmitter through a transmission line.

In an embodiment, a data transmission circuit may include: a transmitter configured to control a current leakage amount of an output terminal in response to a result of detecting a level of the output terminal, and thereby offset an increment in the level of the output terminal; and a receiver electrically coupled with the transmitter through a transmission line.

In an embodiment, a system may include: a processor; a chipset configured to couple with the processor; a memory controller configured to receive data provided from the processor through the chipset; and a memory device configured to receive the data, the memory device including: a transmitter configured to control a current leakage amount of an output terminal in response to a result of detecting a level of the output terminal, and thereby offset an increment in the level of the output terminal, wherein the memory controller comprises a receiver electrically coupled with the transmitter through a transmission line.

DETAILED DESCRIPTION

Hereinafter, examples of data transmission circuits according to various embodiments will be described below with reference to the accompanying drawings.

The data transmission circuit according to the various embodiments may be capable of stably retaining the level of an output voltage. Thus, since the level of an output voltage may be stably retained, the reliability of transmission data may be improved.

Figure 1:
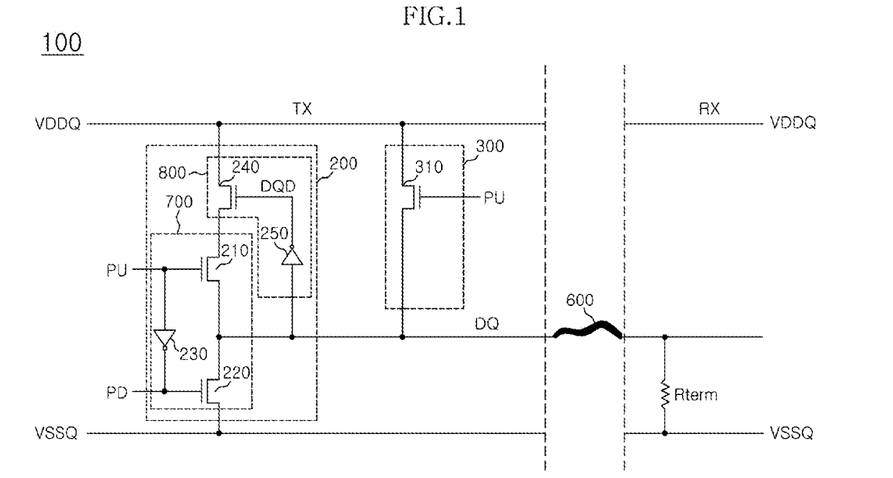
FIGS. 1 to 7 are examples of circuit diagrams of data transmission circuits in accordance the embodiments.

As shown in FIG. 1, a data transmission circuit 100 in accordance with an embodiment which includes a transmitter TX.

The transmitter TX may be electrically coupled with a receiver RX through a transmission line 600.

The transmitter TX may be included in a semiconductor apparatus. The semiconductor apparatus may be, for example, a semiconductor memory.

The receiver RX may be included in a controller, such as a CPU (central processing unit) and a GPU (graphic processing unit), which instructs the semiconductor apparatus to input/output data.

The input terminal of the receiver RX may be terminated to the level of a ground terminal VSSQ through a termination resistor Rterm.

The transmitter TX may include a first driving block 200 and a second driving block 300.

The first driving block 200 may be configured to drive an output terminal DQ for a first time in response to data driving signals PU and PD and the level of the output terminal DQ.

The second driving block 300 may be configured to drive the output terminal DQ for a second time after the first time, in response to the data driving signal PU.

The first driving block 200 and the second driving block 300 may be constituted by different types of logic elements. The logic elements may include a transistor and an inverter.

The first driving block 200 may be constituted by first type logic elements, and the second driving block 300 may be constituted by second type logic elements.

The first type logic element is a logic element which has a relatively fast response timing but has a relatively poor leakage current characteristic, that is, a low threshold voltage, when compared to the second type logic element.

The second type logic element is a logic element which has a relatively slow response timing but has a relatively excellent leakage current characteristic, that is, a high threshold voltage, when compared to the first type logic element.

The first driving block 200 may include a driver 700 and a driving control unit 800.

The driver 700 may be configured to drive the output terminal DQ in response to the data driving signals PU and PD.

The driver 700 may include a plurality of transistors 210 and 220 and an inverter 230.

The driving control unit 800 may be configured to open the current path of the driver 700 for the first time in response to the level of the output terminal DQ.

The driving control unit 800 may include a transistor 240 and an inverter 250.

The transistors 240 and 210 are electrically coupled between a power supply terminal VDDQ and the output terminal DQ.

The transistor 220 is electrically coupled between the output terminal DQ and the ground terminal VSSQ.

The data driving signal PU and the data driving signal PD are respectively applied to the gates of the transistors 210 and 220.

The data driving signal PU and the data driving signal PD may be generated according to high level data and low level data, respectively.

The inverter 230 inverts the data driving signal PU and applies a resultant signal to the gate of the transistor 220.

The inverter 250 applies a control signal DQD which is generated by delaying and inverting the level of the output terminal DQ, to the gate of the transistor 240.

The second driving block 300 may include a transistor 310 which is electrically coupled between the power supply terminal VDDQ and the output terminal DQ.

The data driving signal PU is applied to the gate of the transistor 310.

Operations of the data transmission circuit 100 in accordance with an embodiment, configured as mentioned above, will be described below.

In an initial operation, since the output terminal DQ has a low level, the inverter 250 of the first driving block 200 generates the control signal DQD of a high level by delaying and inverting the level of the output terminal DQ.

According to the control signal DQD of the high level, the transistor 240 opens the current path between the power supply terminal VDDQ and the transistor 210.

The transistor 210 raises the output terminal DQ to a high level in response to the data driving signal PU.

As the level of the output terminal DQ rises and becomes equal to or higher than the threshold voltage of the inverter 250, the inverter 250 transitions the control signal DQD to a low level.

According to the control signal DQD of the low level, the transistor 240 blocks the current path between the power supply terminal VDDQ and the transistor 210.

Therefore, the first driving block 200 drives the output terminal DQ for only the first time.

As described above, the transistor 310 of the second driving block 300 has a threshold voltage higher than the logic elements of the first driving block 200.

Accordingly, the transistor 310 of the second driving block 300 drives the output terminal DQ for the second time in response to the data driving signal PU, at a timing later than the transistor 210 of the first driving block 200, that is, after ending of the first time.

The second time may be a time from after ending of the first time to until the level of the data driving signal PU falls to be lower than the threshold voltage thereof.

In the data transmission circuit 100 in accordance with an embodiment, after quick driving of the output terminal DQ is performed for the first time by using the first driving block 200 which has a relatively fast responding speed but has a relatively poor leakage current characteristic, the output terminal DQ is retained at the high level for the second time by using the second driving block 300 which has a relatively slow responding speed but has a relatively excellent leakage current characteristic. As a consequence, it is possible to secure a fast driving speed and improve a leakage current characteristic.

Figure 2:
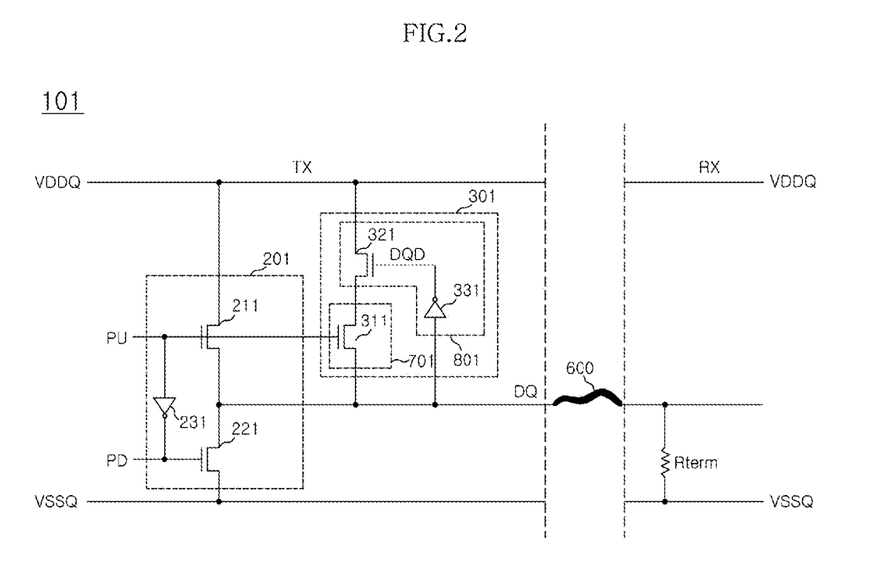

As shown in FIG. 2, a data transmission circuit 101 in accordance with an embodiment includes a transmitter TX.

The transmitter TX may be electrically coupled with a receiver RX through a transmission line 600.

The transmitter TX may be included in a semiconductor apparatus. The semiconductor apparatus may be, for example, a semiconductor memory.

The receiver RX may be included in a controller, such as a CPU and a GPU, which instructs the semiconductor apparatus to input/output data.

The input terminal of the receiver RX may be terminated to the level of a ground terminal VSSQ through a termination resistor Rterm.

The transmitter TX may include a first driving block 201 and a second driving block 301.

In the data transmission circuit 101 in accordance with an embodiment, when compared to FIG. 1, it is exemplified that the first driving block 201 is constituted by a second type logic element and the second driving block 301 is constituted by a first type logic element.

Therefore, the second driving block 301 may be configured to first drive an output terminal DQ for a first time, and the first driving block 201 may be configured to drive the output terminal DQ for a second time after the first time.

The first driving block 201 may be configured to drive the output terminal DQ for the second time in response to data driving signals PU and PD.

The second driving block 301 may be configured to drive the output terminal DQ for the first time before the second time in response to the data driving signal PU and the level of the output terminal DQ.

The first driving block 201 may include a plurality of transistors 211 and 221 and an inverter 231.

The second driving block 301 may include a driver 701 and a driving control unit 801.

The driver 701 may be configured to drive the output terminal DQ in response to the data driving signal PU.

The driver 701 may include a transistor 311.

The driving control unit 801 may be configured to open the current path of the driver 701 for the first time in response to the level of the output terminal DQ.

The driving control unit 801 may include a transistor 321 and an inverter 331.

The transistor 211 is electrically coupled between a power supply terminal VDDQ and the output terminal DQ.

The transistor 221 is electrically coupled between the output terminal DQ and the ground terminal VSSQ.

The data driving signal PU and the data driving signal PD are respectively applied to the gates of the transistors 211 and 221.

The inverter 231 inverts the data driving signal PU and applies a resultant signal to the gate of the transistor 221.

The transistors 321 and 311 are electrically coupled between the power supply terminal VDDQ and the output terminal DQ.

The data driving signal PU is applied to the gate of the transistor 311.

The inverter 331 applies a control signal DQD which is generated by delaying and inverting the level of the output terminal DQ, to the gate of the transistor 321.

Operations of the data transmission circuit 101 in accordance with an embodiment, configured as mentioned above, will be described below.

In an initial operation, since the output terminal DQ has a low level, the inverter 331 of the second driving block 301 generates the control signal DQD of a high level by delaying and inverting the level of the output terminal DQ.

According to the control signal DQD of the high level, the transistor 321 opens the current path between the power supply terminal VDDQ and the transistor 311.

The transistor 311 raises the output terminal DQ to a high level in response to the data driving signal PU.

As the level of the output terminal DQ rises and becomes equal to or higher than the threshold voltage of the inverter 331, the inverter 331 transitions the control signal DQD to a low level.

According to the control signal DQD of the low level, the transistor 321 blocks the current path between the power supply terminal VDDQ and the transistor 311.

Therefore, the second driving block 301 drives the output terminal DQ for only the first time.

As described above, the transistor 211, as the second type logic element, of the first driving block 201 has a threshold voltage higher than the first type logic elements of the second driving block 301.

Accordingly, the transistor 211 of the first driving block 201 drives the output terminal DQ for the second time in response to the data driving signal PU, at a timing later than the transistor 311 of the second driving block 301, that is, after ending of the first time.

The second time may be a time from after ending of the first time to until the level of the data driving signal PU falls to be lower than the threshold voltage thereof.

In the data transmission circuit 101 in accordance with an embodiment, after quick driving of the output terminal DQ is performed for the first time by using the second driving block 301 which has a relatively fast responding speed but has a relatively poor leakage current characteristic, the output terminal DQ is retained at the high level for the second time by using the first driving block 201 which has a relatively slow responding speed but has a relatively excellent leakage current characteristic. As a consequence, it is possible to secure a fast driving speed and improve a leakage current characteristic.

Figure 3:
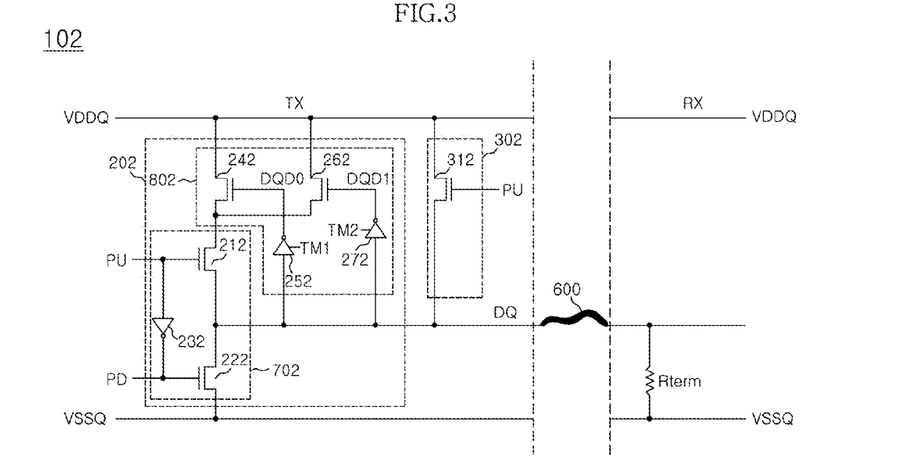

As shown in FIG. 3, a data transmission circuit 102 in accordance with an embodiment includes a transmitter TX.

The transmitter TX may be electrically coupled with a receiver RX through a transmission line 600.

The transmitter TX may be included in a semiconductor apparatus. The semiconductor apparatus may be, for example, a semiconductor memory.

The receiver RX may be included in a controller, such as a CPU and a GPU, which instructs the semiconductor apparatus to input/output data.

The input terminal of the receiver RX may be terminated to the level of a ground terminal VSSQ through a termination resistor Rterm.

The transmitter TX may include a first driving block 202 and a second driving block 302.

The first driving block 202 may be configured to drive an output terminal DQ for a first time in response to data driving signals PU and PD and the level of the output terminal DQ, and be controlled in its driving force in response to a plurality of test signals TM1 and TM2.

The second driving block 302 may be configured to drive the output terminal DQ for a second time after the first time, in response to the data driving signal PU.

The first driving block 202 and the second driving block 302 may be constituted by different types of logic elements. The logic elements may include a transistor and an inverter.

The first driving block 202 may be constituted by first type logic elements, and the second driving block 302 may be constituted by second type logic elements.

The first type logic element is a logic element which has a relatively fast response timing but has a relatively poor leakage current characteristic, that is, a low threshold voltage, when compared to the second type logic element.

The second type logic element is a logic element which has a relatively slow response timing but has a relatively excellent leakage current characteristic, that is, a high threshold voltage, when compared to the first type logic element.

The first driving block 202 may include a driver 702 and a driving control unit 802.

The driver 702 may be configured to drive the output terminal DQ in response to the data driving signals PU and PD.

The driver 702 may include a plurality of transistors 212 and 222 and an inverter 232.

The driving control unit 802 may be configured to open the current path of the driver 702 for the first time in response to the level of the output terminal DQ.

The driving control unit 802 may control the amount of current supplied through the current path of the driver 702, in response to the plurality of test signals TM1 and TM2.

The driving control unit 802 may include a plurality of transistors 242 and 262 and a plurality of inverters 252 and 272.

The current driving forces of the plurality of transistors 242 and 262 may be different.

The transistors 242 and 262 are electrically coupled in parallel to a power supply terminal VDDQ.

The transistor 212 is electrically coupled between the transistors 242 and 262 and the output terminal DQ.

The transistor 222 is electrically coupled between the output terminal DQ and the ground terminal VSSQ.

The data driving signal PU and the data driving signal PD are respectively applied to the gates of the transistors 212 and 222.

The data driving signal PU and the data driving signal PD may be generated according to high level data and low level data, respectively.

The inverter 232 inverts the data driving signal PU and applies a resultant signal to the gate of the transistor 222.

The inverter 252 applies a first control signal DQD0 which is generated by delaying and inverting the level of the output terminal DQ, to the gate of the transistor 242.

The inverter 272 applies a second control signal DQD1 which is generated by delaying and inverting the level of the output terminal DQ, to the gate of the transistor 262.

The second driving block 302 includes a transistor 312 which is electrically coupled between the power supply terminal VDDQ and the output terminal DQ.

The data driving signal PU is applied to the gate of the transistor 312.

Operations of the data transmission circuit 102 in accordance with an embodiment, configured as mentioned above, will be described below.

First, any one or both of the inverters 252 and 272 are activated using the plurality of test signals TM1 and TM2.

As described above, the current driving forces of the transistors 242 and 262 may be different. Namely, the current driving force of any one of the two transistors 242 and 262 may be relatively larger than the other of the two transistors 242 and 262.

Therefore, the amount of current supplied to the current path of the driver 702 may be controlled by activating any one or both of the inverters 252 and 272 by using the plurality of test signals TM1 and TM2, and accordingly, the driving force of the first driving block 202 may be controlled.

For example, it is assumed that the test signal TM1 is activated among the plurality of test signals TM1 and TM2.

In an initial operation, since the output terminal DQ has a low level, the inverter 252 of the first driving block 202 generates the first control signal DQD0 of a high level by delaying and inverting the level of the output terminal DQ.

According to the first control signal DQD0 of the high level, the transistor 242 opens the current path between the power supply terminal VDDQ and the transistor 212.

The transistor 212 raises the output terminal DQ to a high level in response to the data driving signal PU.

As the level of the output terminal DQ rises and becomes equal to or higher than the threshold voltage of the inverter 252, the inverter 252 transitions the first control signal DQD0 to a low level.

According to the first control signal DQD0 of the low level, the transistor 242 blocks the current path between the power supply terminal VDDQ and the transistor 212.

Therefore, the first driving block 202 drives the output terminal DQ for only the first time.

As described above, the transistor 312 of the second driving block 302 has a threshold voltage higher than the logic elements of the first driving block 202.

Accordingly, the transistor 312 of the second driving block 302 drives the output terminal DQ for the second time in response to the data driving signal PU, at a timing later than the transistor 212 of the first driving block 202, that is, after ending of the first time.

The second time may be a time from after ending of the first time to until the level of the data driving signal PU falls to be lower than the threshold voltage thereof.

In the data transmission circuit 102 in accordance with an embodiment, after quick driving of the output terminal DQ is performed for the first time by using the first driving block 202 which has a relatively fast responding speed but has a relatively poor leakage current characteristic, the output terminal DQ is retained at the high level for the second time by using the second driving block 302 which has a relatively slow responding speed but has a relatively excellent leakage current characteristic. As a consequence, it is possible to secure a fast driving speed and improve a leakage current characteristic.

Also, by controlling the current amount of the current path, it is possible to control the driving force of the first driving block 202.

Figure 4:
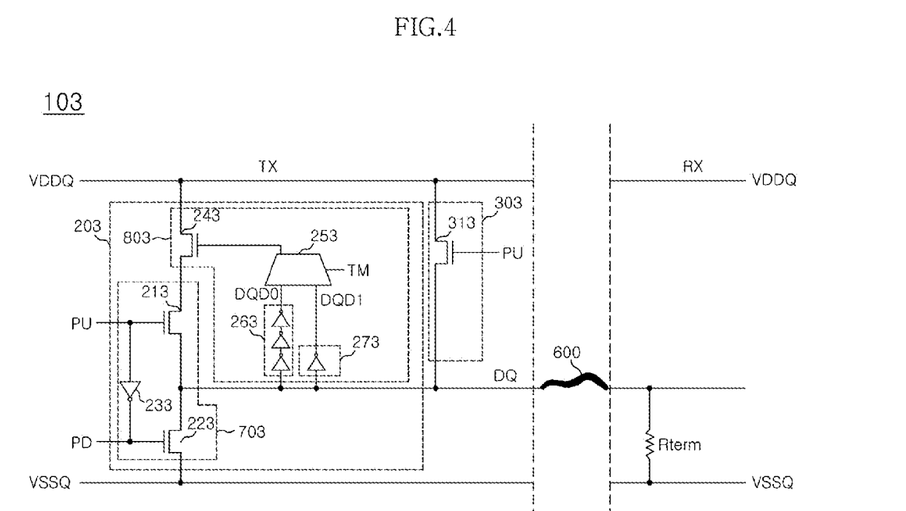

As shown in FIG. 4, a data transmission circuit 103 in accordance with an embodiment includes a transmitter TX.

The transmitter TX may be electrically coupled with a receiver RX through a transmission line 600.

The transmitter TX may be included in a semiconductor apparatus. The semiconductor apparatus may be, for example, a semiconductor memory.

The receiver RX may be included in a controller, such as a CPU and a GPU, which instructs the semiconductor apparatus to input/output data.

The input terminal of the receiver RX may be terminated to the level of a ground terminal VSSQ through a termination resistor Rterm.

The transmitter TX may include a first driving block 203 and a second driving block 303.

The first driving block 203 may be configured to drive an output terminal DQ for a first time in response to data driving signals PU and PD and the level of the output terminal DQ, and control the length of the first time in response to a test signal TM.

The second driving block 303 may be configured to drive the output terminal DQ for a second time after the first time, in response to the data driving signal PU.

The first driving block 203 and the second driving block 303 may be constituted by different types of logic elements. The logic elements may include a transistor and an inverter.

The first driving block 203 may be constituted by first type logic elements, and the second driving block 303 may be constituted by second type logic elements.

The first type logic element is a logic element which has a relatively fast response timing but has a relatively poor leakage current characteristic, that is, a low threshold voltage, when compared to the second type logic element.

The second type logic element is a logic element which has a relatively slow response timing but has a relatively excellent leakage current characteristic, that is, a high threshold voltage, when compared to the first type logic element.

The first driving block 203 may include a driver 703 and a driving control unit 803.

The driver 703 may be configured to drive the output terminal DQ in response to the data driving signals PU and PD.

The driver 703 may include a plurality of transistors 213 and 223 and an inverter 233.

The driving control unit 803 may be configured to open the current path of the driver 703 for the first time in response to the level of the output terminal DQ.

The driving control unit 803 may be configured to control the length of the first time in response to the test signal TM.

The driving control unit 803 may include a transistor 243, a multiplexer 253, and a plurality of delays 263 and 273.

The plurality of delays 263 and 273 may be configured to delay and invert the level of the output terminal DQ by different times and generate first and second control signals DQD0 and DQD1.

The plurality of delays 263 and 273 may be constituted by different numbers of inverters.

The multiplexer 253 may be configured to select one of the first and second control signals DQD0 and DQD1 in response to the test signal TM, and apply the selected control signal to the gate of the transistor 243.

The transistors 243 and 213 are electrically coupled between a power supply terminal VDDQ and the output terminal DQ.

The transistor 223 is electrically coupled between the output terminal DQ and the ground terminal VSSQ.

The data driving signal PU and the data driving signal PD are respectively applied to the gates of the transistors 213 and 223.

The data driving signal PU and the data driving signal PD may be generated according to high level data and low level data, respectively.

The inverter 233 inverts the data driving signal PU and applies a resultant signal to the gate of the transistor 223.

The second driving block 303 includes a transistor 313 which is electrically coupled between the power supply terminal VDDQ and the output terminal DQ.

The data driving signal PU is applied to the gate of the transistor 313.

Operations of the data transmission circuit 103 in accordance with an embodiment, configured as mentioned above, will be described below.

First, one of the first and second control signals DQD0 and DQD1 is selected using the test signal TM.

As described above, the delay times of the first and second control signals DQD0 and DQD1 are different. That is to say, the delay time of the first control signal DQD0 is longer than the delay time of the second control signal DQD1.

Therefore, by selecting one of the control signals DQD0 and DQD1 by using the test signal TM, the first time, that is, a time for opening the current path of the driver 703, may be controlled, and accordingly, the driving force of the first driving block 203 may be controlled.

For example, it is assumed that the first control signal DQD0 is selected between the first and second control signals DQD0 and DQD1.

In an initial operation, since the output terminal DQ has a low level, the delay 263 of the first driving block 203 generates the first control signal DQD0 of a high level by delaying and inverting the level of the output terminal DQ.

According to the first control signal DQD0 of the high level, the transistor 243 opens the current path between the power supply terminal VDDQ and the transistor 213.

The transistor 213 raises the output terminal DQ to a high level in response to the data driving signal PU.

As the level of the output terminal DQ rises and becomes equal to or higher than the threshold voltage of the inverters constituting the delay 263, the delay 263 transitions the first control signal DQD0 to a low level.

According to the first control signal DQD0 of the low level, the transistor 243 blocks the current path between the power supply terminal VDDQ and the transistor 213.

Therefore, the first driving block 203 drives the output terminal DQ for only the first time.

As described above, the transistor 313 of the second driving block 303 has a threshold voltage higher than the logic elements of the first driving block 203.

Accordingly, the transistor 313 of the second driving block 303 drives the output terminal DQ for the second time in response to the data driving signal PU, at a timing later than the transistor 213 of the first driving block 203, that is, after ending of the first time.

The second time may be a time from after ending of the first time to until the level of the data driving signal PU falls to be lower than the threshold voltage thereof.

In the data transmission circuit 103 in accordance with an embodiment, after quick driving of the output terminal DQ is performed for the first time by using the first driving block 203 which has a relatively fast responding speed but has a relatively poor leakage current characteristic, the output terminal DQ is retained at the high level for the second time by using the second driving block 303 which has a relatively slow responding speed but has a relatively excellent leakage current characteristic. As a consequence, it is possible to secure a fast driving speed and improve a leakage current characteristic.

Also, by controlling the opening time of the current path, it is possible to control the driving force of the first driving block 203.

Figure 5:
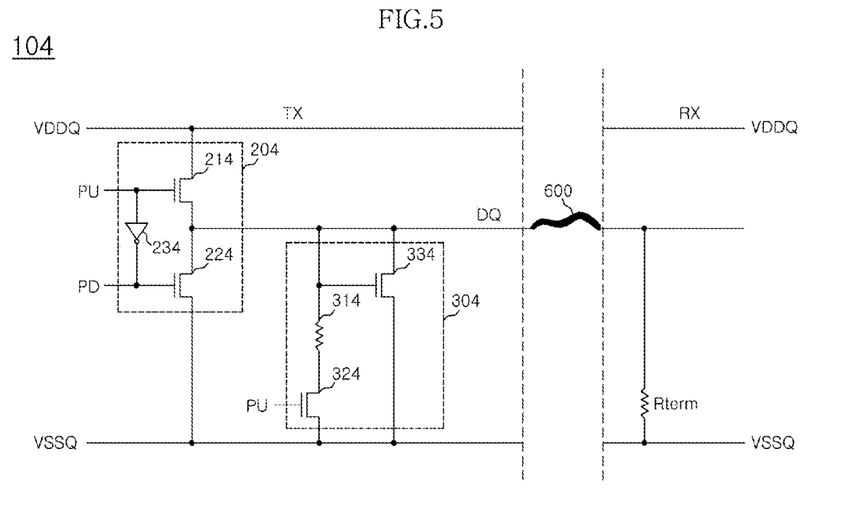

As shown in FIG. 5, a data transmission circuit 104 in accordance with an embodiment includes a transmitter TX.

The transmitter TX may be electrically coupled with a receiver RX through a transmission line 600.

The transmitter TX may be included in a semiconductor apparatus. The semiconductor apparatus may be, for example, a semiconductor memory.

The receiver RX may be included in a controller, such as a CPU and a GPU, which instructs the semiconductor apparatus to input/output data.

The input terminal of the receiver RX may be terminated to the level of a ground terminal VSSQ through a termination resistor Rterm.

The transmitter TX may include a driving block 204 and a compensation block 304.

The driving block 204 may be configured to drive an output terminal DQ in response to data driving signals PU and PD.

The compensation block 304 may be configured to control the amount of the leakage current of the output terminal DQ in response to the data driving signal PU and a result of detecting the level of the output terminal DQ, and offset an increment in the level of the output terminal DQ.

The driving block 204 and the compensation block 304 may be constituted by different types of logic elements. The logic elements may include a transistor and an inverter.

The driving block 204 may be constituted by first type logic elements, and the compensation block 304 may be constituted by second type logic elements.

The first type logic element is a logic element which has a relatively fast response timing but has a relatively poor leakage current characteristic, that is, a low threshold voltage, when compared to the second type logic element.

The second type logic element is a logic element which has a relatively slow response timing but has a relatively excellent leakage current characteristic, that is, a high threshold voltage, when compared to the first type logic element.

The driving block 204 may include a plurality of transistors 214 and 224 and an inverter 234.

The transistor 214 is electrically coupled between a power supply terminal VDDQ and the output terminal DQ.

The transistor 224 is electrically coupled between the output terminal DQ and the ground terminal VSSQ.

The data driving signal PU and the data driving signal PD are respectively applied to the gates of the transistors 214 and 224.

The inverter 234 inverts the data driving signal PU and applies a resultant signal to the gate of the transistor 224.

The compensation block 304 may include a resistor 314 and a plurality of transistors 324 and 334.

The resistor 314 has one end which is electrically coupled to the output terminal DQ.

The resistor 314 may have a resistance value equal to or larger than the termination resistor Rterm of the receiver RX.

The transistor 324 is electrically coupled between the other end of the resistor 314 and the ground terminal VSSQ.

The transistor 334 is electrically coupled between the output terminal DQ and the ground terminal VSSQ in parallel to the transistor 324, and has the gate to which the one end of the resistor 314 is electrically coupled.

Operations of the data transmission circuit 104 in accordance with an embodiment, configured as mentioned above, will be described below.

The driving block 204 drives the output terminal DQ in response to the data driving signal PU.

As described above, the transistor 324 as the second type logic element of the compensation block 304 has a threshold voltage higher than the first type logic elements of the driving block 204.

The transistor 324 of the compensation block 304 operates at a timing later than the transistor 214 of the driving block 204 in response to the data driving signal PU, and flows current through the resistor 314.

When high level data is continuously outputted, the voltage level of the output terminal DQ, that is, the level of an output voltage (VOH) may rise to become equal to or higher than a target level.

The transistor 334 allows current of an amount corresponding to the level of the gate thereof, that is, changes in the voltages applied to both ends of the resistor 314, to flow from the output terminal DQ to the ground terminal VSSQ, and lowers the voltage level of the output terminal DQ.

The compensation block 304 may retain the voltage level of the output terminal DQ to the target level, through the above-described operations.

If the data driving signal PU is deactivated, since the transistor 324 is turned off, the operation of the compensation block 304 is interrupted.

In the data transmission circuit 104 in accordance with an embodiment, by allowing leakage current to flow from the output terminal DQ only when the level of the output terminal DQ rises to become equal to or higher than the target level, by using the compensation block 304, it is possible to retain the output terminal DQ at the target level.

Figure 6:
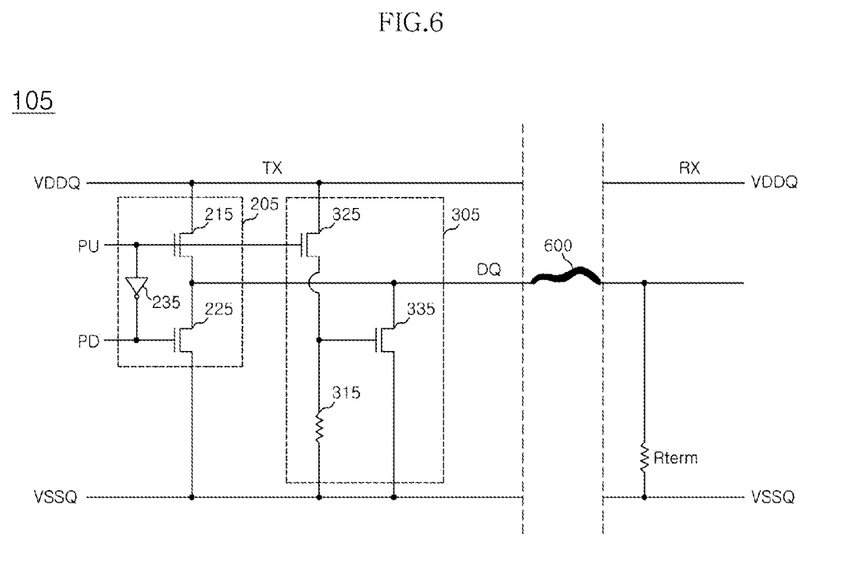

As shown in FIG. 6, a data transmission circuit 105 in accordance with an embodiment includes a transmitter TX.

The transmitter TX may be electrically coupled with a receiver RX through a transmission line 600.

The transmitter TX may be included in a semiconductor apparatus. The semiconductor apparatus may be, for example, a semiconductor memory.

The receiver RX may be included in a controller, such as a CPU and a GPU, which instructs the semiconductor apparatus to input/output data.

The input terminal of the receiver RX may be terminated to the level of a ground terminal VSSQ through a termination resistor Rterm.

The transmitter TX may include a driving block 205 and a compensation block 305.

The driving block 205 may be configured to drive an output terminal DQ in response to data driving signals PU and PD.

The compensation block 305 may be configured to control the amount of the leakage current of the output terminal DQ in response to the data driving signal PU and a result of detecting the level of the output terminal DQ, and offset an increment in the level of the output terminal DQ.

The driving block 205 may include a plurality of transistors 215 and 225 and an inverter 235.

The transistor 215 is electrically coupled between a power supply terminal VDDQ and the output terminal DQ.

The transistor 225 is electrically coupled between the output terminal DQ and the ground terminal VSSQ.

The data driving signal PU and the data driving signal PD are respectively applied to the gates of the transistors 215 and 225.

The inverter 235 inverts the data driving signal PU and applies a resultant signal to the gate of the transistor 225.

The compensation block 305 may include a resistor 315 and a plurality of transistors 325 and 335.

The transistor 325 is electrically coupled to the power supply terminal VDDQ.

The resistor 315 has one end which is electrically coupled to the transistor 325 and the other end which is electrically coupled to the ground terminal VSSQ.

The resistor 315 may have a resistance value equal to or larger than the termination resistor Rterm of the receiver RX.

The transistor 335 is electrically coupled between the output terminal DQ and the ground terminal VSSQ, and has the gate to which the one end of the resistor 315 is electrically coupled.

Unlike FIG. 5, the compensation block 305 indirectly detects the level of the output terminal DQ through a circuit configuration which copies the current of the driving block 205, thereby performing a leakage current control independent of the level of the output terminal DQ.

The driving block 205 may be constituted by first type logic elements, and the components of the compensation block 305 excluding the transistor 325 may be constituted by second type logic elements.

Since the transistor 325 plays the role of copying the current of the driving block 205, the transistor 325 may be constituted by a first type logic element similarly to the transistor 215 of the driving block 205.

The first type logic element is a logic element which has a relatively fast response timing but has a relatively poor leakage current characteristic, that is, a low threshold voltage, when compared to the second type logic element.

The second type logic element is a logic element which has a relatively slow response timing but has a relatively excellent leakage current characteristic, that is, a high threshold voltage, when compared to the first type logic element.

Operations of the data transmission circuit 105 in accordance with an embodiment, configured as mentioned above, will be described below.

The driving block 205 drives the output terminal DQ in response to the data driving signal PU.

As described above, the transistor 325 of the compensation block 305 as the first type logic element has the same threshold voltage and thus the same current driving force as the transistor 215 of the driving block 205.

The transistor 325 of the compensation block 305 operates at the same timing as the transistor 215 of the driving block 205 in response to the data driving signal PU, and flows current through the resistor 315.

When high level data is continuously outputted, the voltage level of the output terminal DQ, that is, the level of an output voltage (VOH) may rise to become equal to or higher than a target level.

The transistor 335 allows current of an amount corresponding to the level of the gate thereof, that is, changes in the voltages applied to both ends of the resistor 315, to flow from the output terminal DQ to the ground terminal VSSQ, and lowers the voltage level of the output terminal DQ.

The compensation block 305 may retain the voltage level of the output terminal DQ to the target level, through the above-described operations.

If the data driving signal PU is deactivated, since the transistor 325 is turned off, the operation of the compensation block 305 is interrupted.

In the data transmission circuit 105 in accordance with an embodiment, by allowing leakage current to flow from the output terminal DQ only when the level of the output terminal DQ rises to become equal to or higher than the target level, by using the compensation block 305, it is possible to retain the output terminal DQ at the target level.

Figure 7:
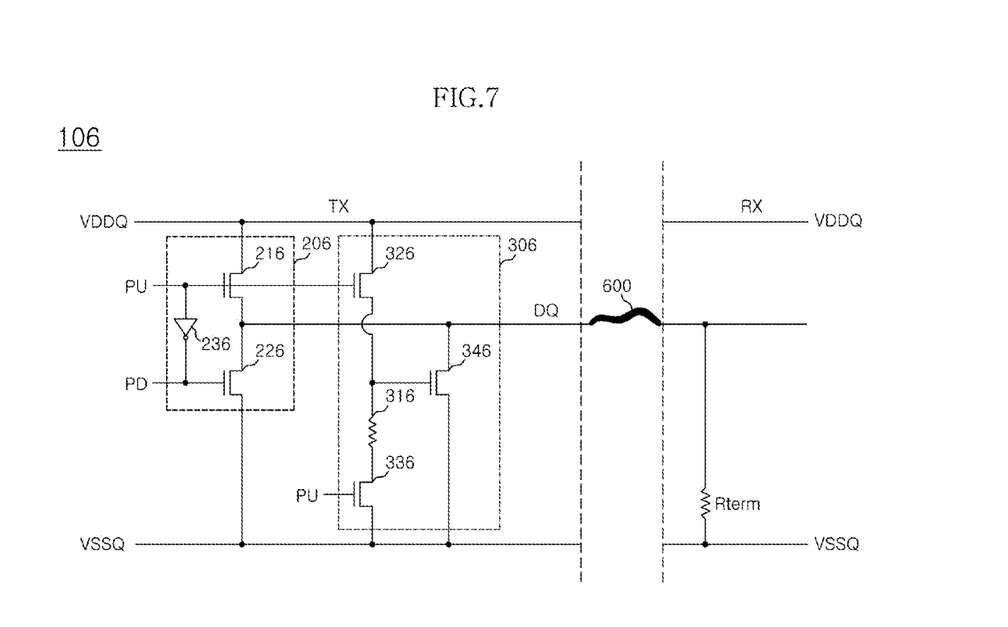

As shown in FIG. 7, a data transmission circuit 106 in accordance with an embodiment includes a transmitter TX.

The transmitter TX may be electrically coupled with a receiver RX through a transmission line 600.

The transmitter TX may be included in a semiconductor apparatus. The semiconductor apparatus may be, for example, a semiconductor memory.

The receiver RX may be included in a controller, such as a CPU and a GPU, which instructs the semiconductor apparatus to input/output data.

The input terminal of the receiver RX may be terminated to the level of a ground terminal VSSQ through a termination resistor Rterm.

The transmitter TX may include a driving block 206 and a compensation block 306.

The driving block 206 may be configured to drive an output terminal DQ in response to data driving signals PU and PD.

The compensation block 306 may be configured to control the amount of the leakage current of the output terminal DQ in response to the data driving signal PU and a result of detecting the level of the output terminal DQ, and offset an increment in the level of the output terminal DQ.

The driving block 206 may include a plurality of transistors 216 and 226 and an inverter 236.

The transistor 216 is electrically coupled between a power supply terminal VDDQ and the output terminal DQ.

The transistor 226 is electrically coupled between the output terminal DQ and the ground terminal VSSQ.

The data driving signal PU and the data driving signal PD are respectively applied to the gates of the transistors 216 and 226.

The inverter 236 inverts the data driving signal PU and applies a resultant signal to the gate of the transistor 226.

The compensation block 306 may include a resistor 316 and a plurality of transistors 326, 336 and 346.

The transistor 326 is electrically coupled to the power supply terminal VDDQ.

The resistor 316 has one end which is electrically coupled to the transistor 326.

The transistor 336 is electrically coupled between the other end of the resistor 316 and the ground terminal VSSQ.

The resistor 316 may have a resistance value equal to or larger than the termination resistor Rterm of the receiver RX.

The transistor 346 is electrically coupled between the output terminal DQ and the ground terminal VSSQ, and has the gate to which the one end of the resistor 316 is electrically coupled.

Unlike FIG. 5, the compensation block 306 detects the level of the output terminal DQ through a circuit configuration which copies the current of the driving block 206, thereby performing a leakage current control independent of the level of the output terminal DQ. Further, unlike FIG. 8, the compensation block 306 copies the current of the driving block 206 such that a generated voltage level is higher than the level of the output terminal DQ.

The driving block 206 may be constituted by first type logic elements, and the components of the compensation block 306 excluding the transistor 326 may be constituted by second type logic elements.

Since the transistor 326 plays the role of copying the current of the driving block 206, the transistor 326 may be constituted by a first type logic element similarly to the transistor 216 of the driving block 206.

The first type logic element is a logic element which has a relatively fast response timing but has a relatively poor leakage current characteristic, that is, a low threshold voltage, when compared to the second type logic element.

The second type logic element is a logic element which has a relatively slow response timing but has a relatively excellent leakage current characteristic, that is, a high threshold voltage, when compared to the first type logic element.

Operations of the data transmission circuit 106 in accordance with an embodiment, configured as mentioned above, will be described below.

The driving block 206 drives the output terminal DQ in response to the data driving signal PU.

As described above, the transistor 326 of the compensation block 306 as the first type logic element has the same threshold voltage and thus the same current driving force as the transistor 216 of the driving block 206.

The transistor 326 of the compensation block 306 operates at the same timing as the transistor 216 of the driving block 206 in response to the data driving signal PU, and flows current through the resistor 316.

When high level data is continuously outputted, the voltage level of the output terminal DQ, that is, the level of an output voltage (VOH) may rise to become equal to or higher than a target level.

The transistor 346 allows current of an amount corresponding to the level of the gate thereof, that is, changes in the voltages applied to both ends of the resistor 316, to flow from the output terminal DQ to the ground terminal VSSQ, and lowers the voltage level of the output terminal DQ.

The compensation block 306 may retain the voltage level of the output terminal DQ to the target level, through the above-described operations.

If the data driving signal PU is deactivated, since the transistors 326 and 336 are turned off, the operation of the compensation block 306 is interrupted.

In the data transmission circuit 106 in accordance with an embodiment, by allowing leakage current to flow from the output terminal DQ only when the level of the output terminal DQ rises to become equal to or higher than the target level, by using the compensation block 306, it is possible to retain the output terminal DQ at the target level.

Figure 8:
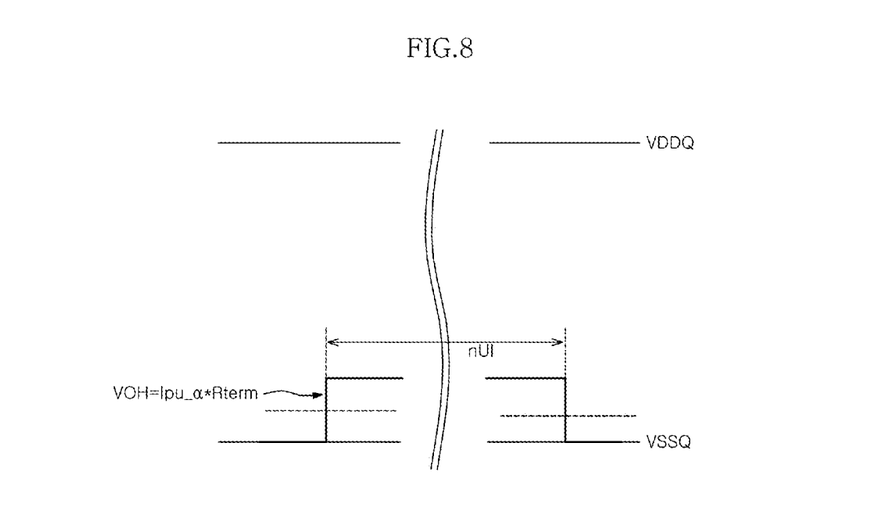
FIG. 8 is a waveform diagram of an output voltage according to the embodiments.

In the data transmission circuits 100 to 106 in accordance with the embodiments, as can be seen from FIG. 8, an output voltage VOH may be stably retained at a target level through the above-described control scheme even though high level data is continuously outputted for a plurality of unit intervals nUI.

The data transmission circuits discussed above are particular useful in the design of memory devices, processors, and computer systems. For example, referring to FIG. 9, a block diagram of a system employing the data transmission circuits in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented. A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one receiver RX as discussed above with reference to FIGS. 1-8. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the transmitter TX as discussed above with relation to FIGS. 1-9, the memory devices 1350 may include a plurality of word lines and a plurality of bit lines for defining a plurality of memory cell. As discussed above with regards to FIGS. 1-8 the transmitters TX may be electrically coupled with receivers RX through transmission lines 600. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

Figure 9:
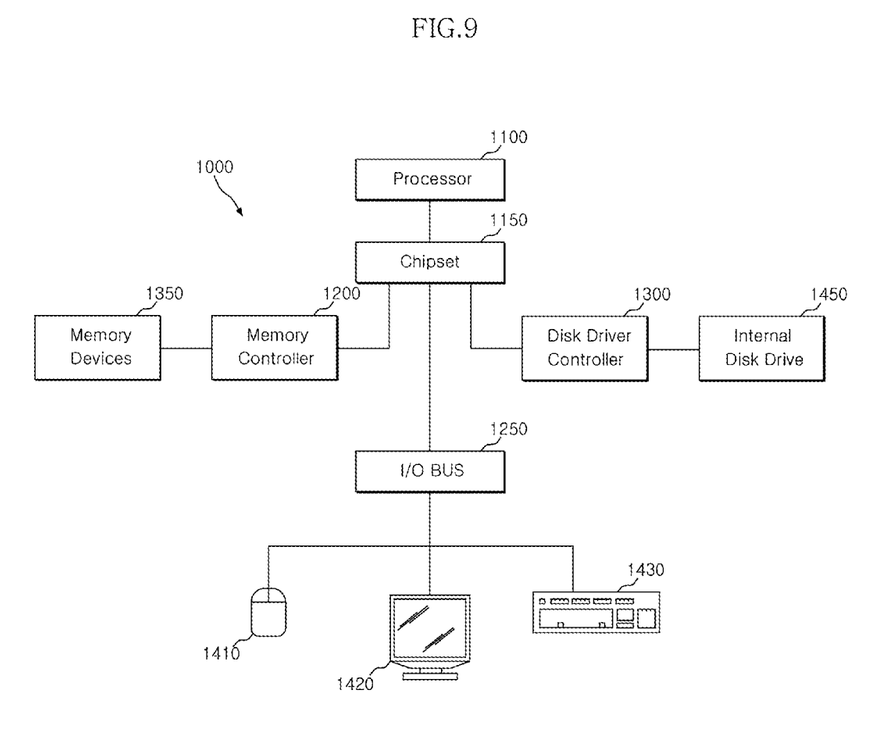
FIG. 9 illustrates a block diagram of a system employing the data transmission circuit in accordance with the embodiments discussed above with relation to FIGS. 1-8.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 9 is merely one example of a system employing the data transmission circuit as discussed above with relation to FIGS. 1-8. In alternate embodiments, such as cellular phones or digital cameras, the components may differ from the embodiments shown in FIG. 9.

While various embodiments have been described above, it will be understood to those skilled in the art that the embodiments described are by way of example only. Accordingly, the data transmission circuit described herein should not be limited based on the described embodiments. Rather, the data transmission circuit described herein should only be limited in light of the claims that follow when taken in conjunction with the above description and accompanying drawings.

What is claimed is:

1. A data transmission circuit comprising:
   a first driving block configured to drive an output terminal for a first time in response to a data driving signal and a level of the output terminal; and
   a second driving block configured to drive the output terminal for a second time after the first time, in response to the data driving signal,
   wherein the first driving block is configured to be controlled in its driving force in response to a test signal.

2. The data transmission circuit according to claim 1, wherein the first driving block comprises logic elements which are designed to have different threshold voltages from logic elements of the second driving block.

3. The data transmission circuit according to claim 1,
   wherein the first driving block and the second driving block comprise first type logic elements and second type logic elements, respectively, and
   wherein the first type logic elements are designed to have relatively low threshold voltages when compared to the second type logic elements.

4. The data transmission circuit according to claim 1, wherein the first driving block comprises:
   a driver configured to drive the output terminal in response to the data driving signal; and
   a driving control unit configured to open a current path of the driver for the first time in response to the level of the output terminal.

5. The data transmission circuit according to claim 1, wherein the first driving block comprises:
   a driver configured to drive the output terminal in response to the data driving signal; and
   a driving control unit configured to control an amount of current to be supplied for the first time through a current path of the driver in response to the test signal.

6. The data transmission circuit according to claim 1, wherein the first driving block comprises:
   a driver configured to drive the output terminal in response to the data driving signal; and
   a driving control unit configured to control a length of the first time in response to the test signal.

7. The data transmission circuit according to claim 6, wherein the driving control unit comprises:
   a transistor electrically coupled between a power supply terminal and the driver;
   a plurality of delays configured to delay the level of the output terminal by different times and generate a plurality of control signals; and
   a multiplexer configured to select one of the plurality of control signals in response to the test signal and apply the selected control signal to the transistor.

8. The data transmission circuit according to claim 1, wherein the first driving block is activated during the first time, and the second driving block is activated during the second time after the first time if a data transits to a first level from a second level, and
   wherein, in the first driving block and the second driving block, only the second driving block is activated if the data maintained the first level.

9. The data transmission circuit according to claim 8, wherein the first level is logic high level and the second level is logic low level.

10. A data transmission circuit comprising:
    a transmitter configured to drive an output terminal for a first time by using first type logic elements, interrupt the driving an output terminal for a first time which is proceeded by the first type logic elements, and drive the output terminal for a second time after the first time by using second type logic elements which are designed to have different threshold voltages from the first type logic elements; and a receiver electrically coupled with the transmitter through a transmission line, wherein the transmitter comprises:

a first driving block constituted by the first type logic elements, and configured to drive the output terminal for the first time in response to a data driving signal and a level of the output terminal; and a second driving block constituted by the second type logic elements, and configured to drive the output terminal for the second time in response to the data driving signal, and wherein the first driving block is configured to be controlled in its driving force in response to a test signal.

11. The data transmission circuit according to claim 10, wherein the receiver is included in a controller outside a semiconductor apparatus including the transmitter, which instructs the semiconductor apparatus to input/output data.

12. The data transmission circuit according to claim 10, wherein the receiver has an input terminal which is terminated to a level of a ground terminal through a termination resistor.

13. The data transmission circuit according to claim 10, wherein the first driving block comprises:

a driver configured to drive the output terminal in response to the data driving signal; and a driving control unit configured to open a current path of the driver for the first time in response to the level of the output terminal.

14. The data transmission circuit according to claim 10, wherein the first driving block comprises:

a driver configured to drive the output terminal in response to the data driving signal; and a driving control unit configured to control an amount of current to be supplied for the first time through a current path of the driver in response to the test signal.

15. The data transmission circuit according to claim 10, wherein the first driving block comprises:

a driver configured to drive the output terminal in response to the data driving signal; and a driving control unit configured to control a length of the first time in response to the test signal.

* * * * *